(12) United States Patent
Kim et al.

(10) Patent No.: US 10,879,155 B2
(45) Date of Patent: Dec. 29, 2020

(54) ELECTRONIC DEVICE WITH DOUBLE-SIDED COOLING

(71) Applicant: Texas Instruments Incorporated, Dallas, TX (US)

(72) Inventors: Woochan Kim, Sunnyvale, CA (US); Anindya Poddar, Sunnyvale, CA (US); Vivek Kishorechand Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/408,113

(22) Filed: May 9, 2019

(65) Prior Publication Data
US 2020/0357729 A1    Nov. 12, 2020

(51) Int. Cl.
| | |
|---|---|
| *H01L 23/495* | (2006.01) |
| *H01L 23/373* | (2006.01) |
| *H01L 23/31* | (2006.01) |
| *H01L 23/00* | (2006.01) |
| *H01L 21/56* | (2006.01) |
| *H01L 21/48* | (2006.01) |

(52) U.S. Cl.
CPC .... *H01L 23/49575* (2013.01); *H01L 21/4825* (2013.01); *H01L 21/56* (2013.01); *H01L 23/3121* (2013.01); *H01L 23/3731* (2013.01); *H01L 23/3736* (2013.01); *H01L 23/49517* (2013.01); *H01L 24/08* (2013.01); *H01L 2224/08245* (2013.01)

(58) Field of Classification Search
CPC ........... H01L 23/49575; H01L 21/4839; H01L 23/49558; H01L 23/5389
See application file for complete search history.

(56) References Cited

U.S. PATENT DOCUMENTS

| | | | |
|---|---|---|---|
| 8,450,151 B1 | 5/2013 | Poddar et al. | |
| 2008/0023824 A1 | 1/2008 | Salzman | |
| 2010/0327424 A1* | 12/2010 | Braunisch | ........... H01L 25/0657 257/692 |
| 2011/0095358 A1 | 4/2011 | Micciche et al. | |
| 2015/0147845 A1 | 5/2015 | Poddar et al. | |
| 2015/0332992 A1* | 11/2015 | Im | .................... H01L 23/49053 257/139 |
| 2019/0013288 A1 | 1/2019 | Kim et al. | |
| 2019/0371778 A1* | 12/2019 | Sankman | ............ H01L 23/3128 |

FOREIGN PATENT DOCUMENTS

| | | |
|---|---|---|
| JP | 10229162 | 8/1998 |
| WO | 2018035226 | 2/2018 |

* cited by examiner

*Primary Examiner* — Thomas L Dickey
(74) *Attorney, Agent, or Firm* — Ronald O. Neerings; Charles A. Brill; Frank D. Cimino

(57) ABSTRACT

A packaged electronic device includes a package structure that encloses first and second semiconductor dies, a die attach pad with a first side attached to one of the dies, and a second side exposed along a side of the package structure, and a substrate that includes a first metal layer exposed along another side of the package structure, a second metal layer soldered to contacts of the dies, and an isolator layer that extends between and separates the first and second metal layers.

35 Claims, 10 Drawing Sheets

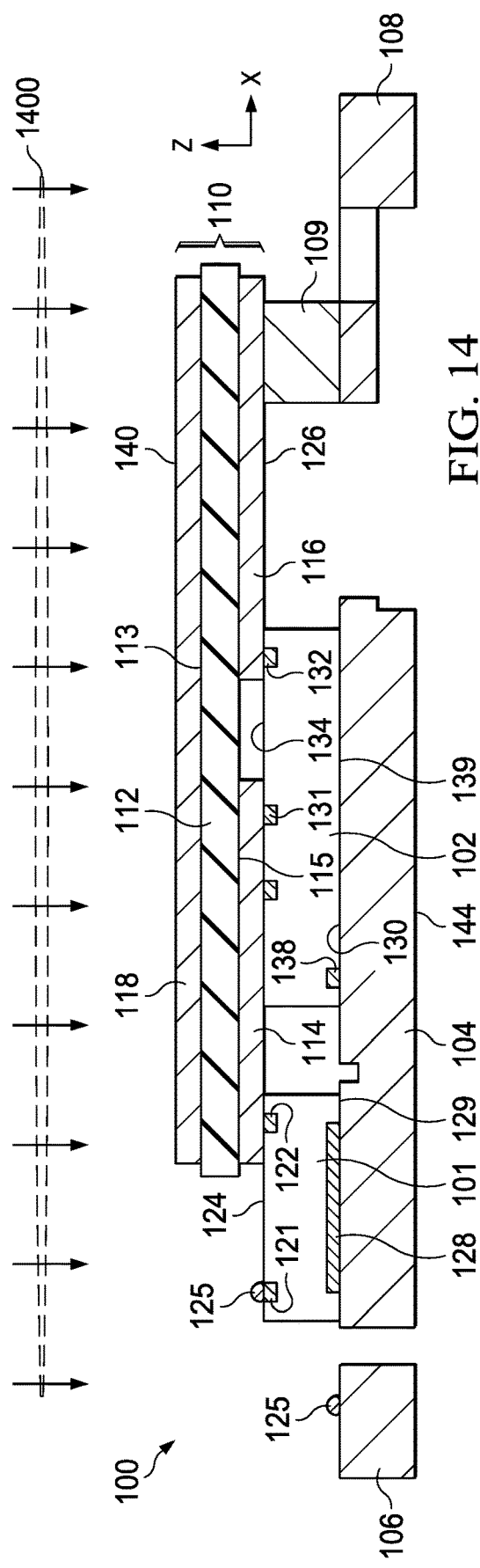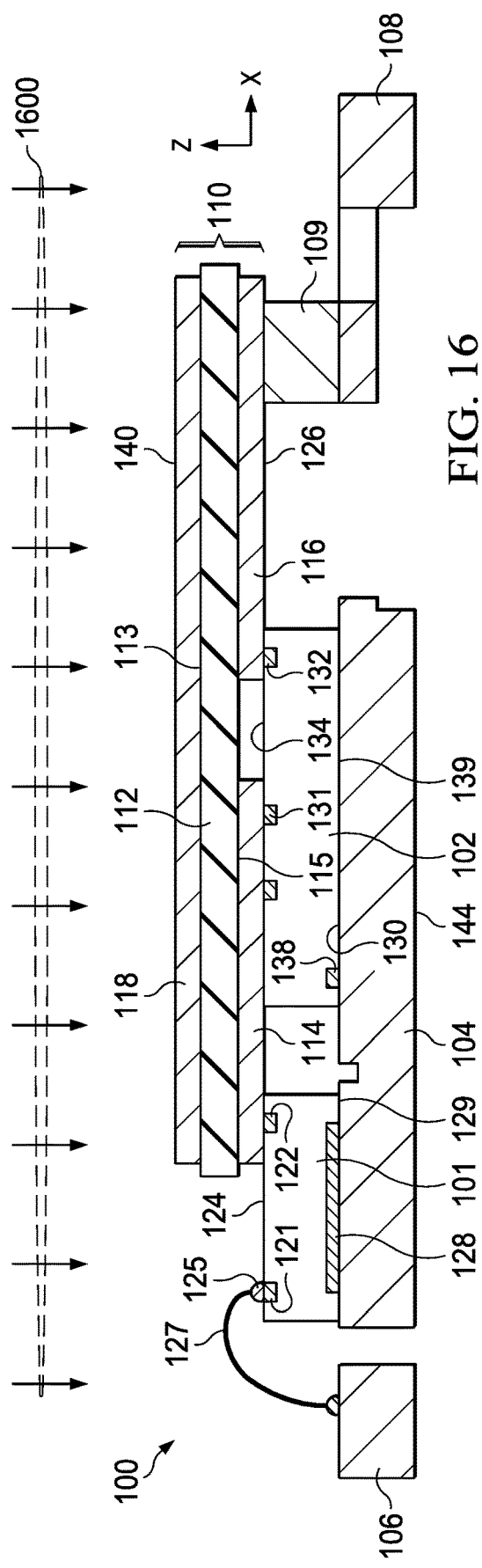

ELECTRONIC DEVICE WITH DOUBLE-SIDED COOLING

BACKGROUND

Transistors and other circuit components of packaged electronic devices have performance characteristics that may vary with operating temperature. Various electronic device package types, such as quad flat no-lead (QFN) packages, may include an exposed die attach pad or other exposed thermal pad to allow cooling through the bottom of the packaged device. Difficulties arise in cooling lateral field effect transistors (FET) in a packaged electronic device. Lateral FET dies have bonding pads with transistor electrical nodes on a top side. The bottom side of the die is sometimes operated at a ground potential. Heat generated from the die dissipates through a bottom side substrate to the outside of the package. Increased power densities call for improved heat removal to facilitate operation of transistors in switching applications, such as DC-DC converters. Heat dissipation through the bottom side of the die and/or package can hinder efforts to increase power density and/or enhance energy efficiency of wide-band-gap (WBG) transistors, such as GaN power stage FETs for switching high voltages at high frequencies. The bond pad layout of lateral FET dies can limit the topside interconnection options to bond wires or solder bump connections that have restricted thermal capacity. One cooling scheme for QFN packages dissipates heat from a die attach pad (DAP) through a printed circuit board (PCB) with thermal vias to a heat sink, with electrically isolating thermal interface material (TIM) between the heatsink and the PCB. However, the electrically isolating thermal interface material is typically a poor thermal conductor.

SUMMARY

A packaged electronic device is described, which includes a die attach pad, first and second semiconductor dies with first sides connected to a first side of the die attach pad, a substrate, and a package structure that encloses the semiconductor dies and portions of the die attach pad and the substrate. The substrate includes a ceramic layer, a first metal layer formed on a first side of the ceramic layer, and a second metal layer formed on a second side of the ceramic layer. The second metal layer is connected to the second sides of the semiconductor dies. A first side of the package structure exposes a portion of the first metal layer of the substrate, and a second side of the package structure exposes a portion of a second side of the die attach pad.

In another aspect, a packaged electronic device includes a package structure that encloses a first semiconductor die and a second semiconductor die, a die attach pad soldered to one of the semiconductor dies and exposed along a side of the package structure, and a substrate with a first metal layer exposed along another side of the package structure, a second metal layer soldered to the semiconductor dies, and an isolator layer that extends between and separates the first and second metal layers.

A described method includes attaching first sides of first and second semiconductor dies to a first side of a die attach pad, attaching a metal layer of a side of a substrate to second sides of the semiconductor dies, and forming a package structure that encloses the semiconductor dies, where the package structure includes a first side that exposes a first metal layer of a side of the substrate, and a second side that exposes a side of the die attach pad.

BRIEF DESCRIPTION OF THE DRAWINGS

FIG. 14 is a sectional side elevation view taken along line 14-14 of FIG. 15, showing a second reflow process that solders contacts of the top sides of the semiconductor dies to a patterned metal layer of the substrate.

FIG. 16 is a sectional side elevation view of the substrate soldered to the top sides of the semiconductor dies and the conductive posts undergoing a wire bonding process.

DETAILED DESCRIPTION

Figure 1:
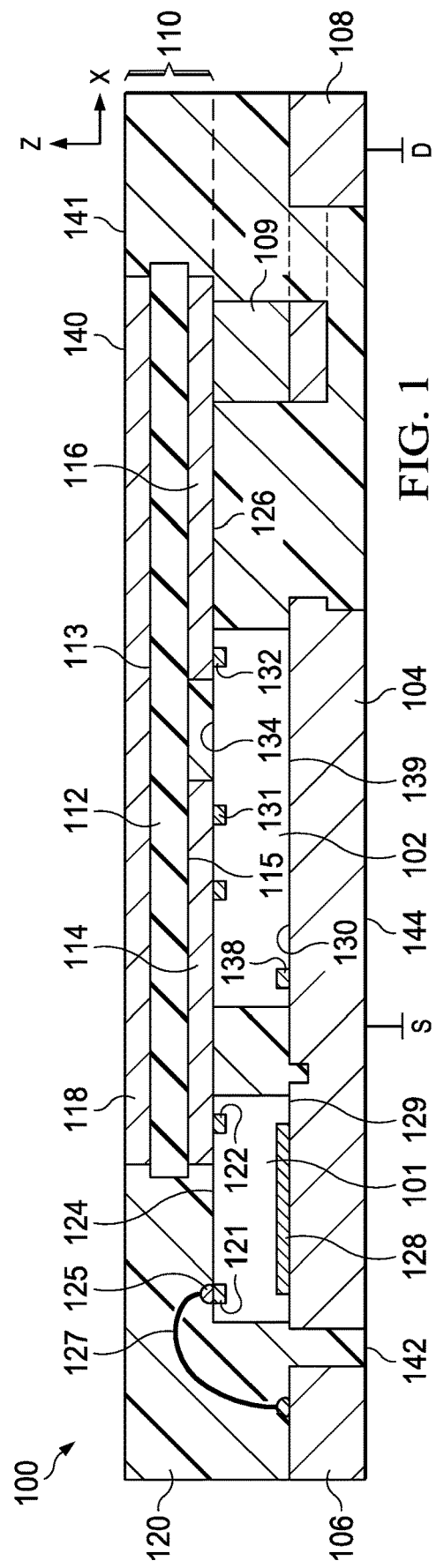
FIG. 1 is a sectional side elevation view of a packaged electronic device taken along lines 1-1 in FIGS. 2 and 3.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
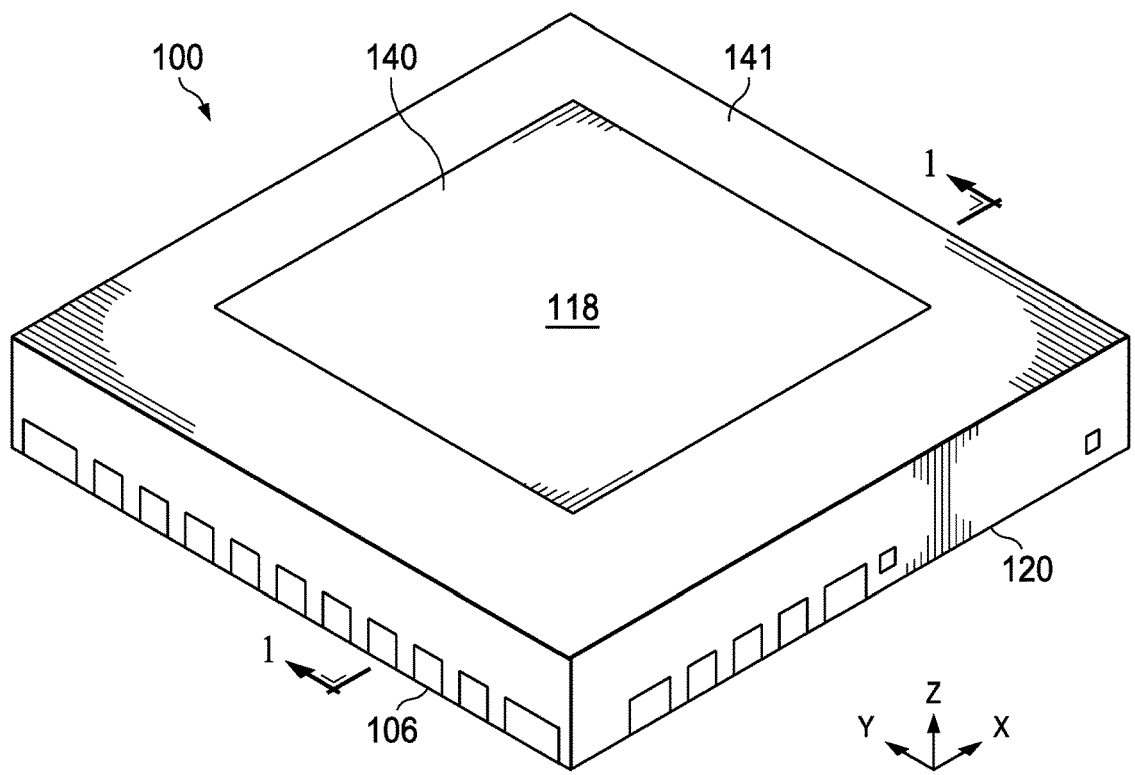
FIG. 2 is a top perspective view of the packaged electronic device of FIG. 1.
Figure 3:
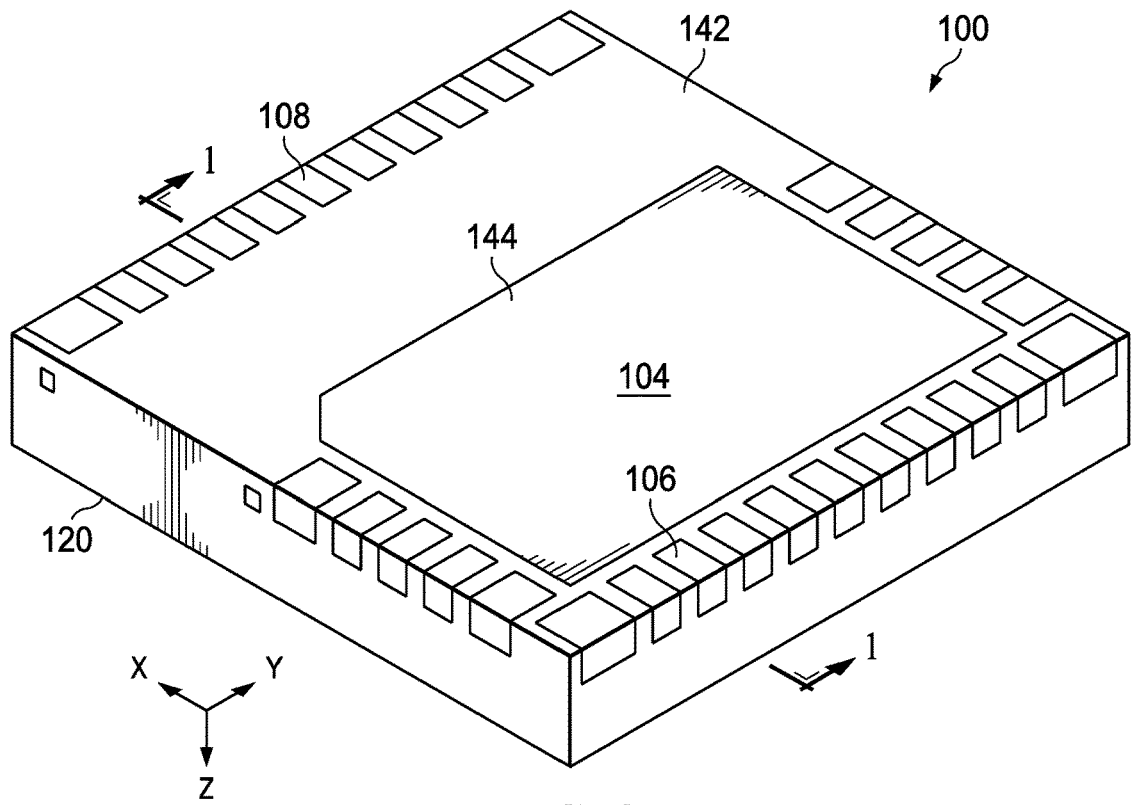
FIG. 3 is a bottom perspective view of the packaged electronic device of FIGS. 1 and 2.

FIGS. 1-3 show an example a packaged electronic device 100 that provides both top and bottom side heat removal paths, which can be used in combination with lateral FETs and other circuit components. FIG. 1 shows a sectional view of the packaged electronic device 100 taken along lines 1-1 in FIGS. 2 and 3, FIG. 2 shows a top perspective view of the packaged electronic device 100, and FIG. 3 shows a bottom perspective view of the packaged electronic device 100. The example packaged electronic device 100 includes a first semiconductor die 101 and a second semiconductor die 102. In another example, more than two semiconductor dies are included in the packaged electronic device 100.

The packaged electronic device 100 in one example is constructed from a starting lead frame structure, with a die attach pad 104 and one or more ultimately detached lead structures referred to as leads. In one example, the packaged electronic device 100 is constructed using a main lead frame structure with the die attach pad 104 and one or more leads, as well as a secondary lead frame structure as discussed further below with respect to FIGS. 11 and 12. The packaged electronic device 100 in FIG. 1 includes a lead 106 originally included with the die attach pad 104 in a main lead frame structure, and a secondary lead 108 originally part of a secondary lead frame structure. The packaged electronic device 100 includes a conductive post 109 connected to the lead 108, for example, by soldering.

In one example, the die attach pad 104, the leads 106 and 108, and the conductive post 109 are a conductive metal, such as copper. In another example, the structures 104, 106, 108 and/or 109 can be a different conductive metal, such as aluminum. In one example, a starting main lead frame includes the illustrated die attach pad 104 and the lead 106, which are later separated prior to molding, and a secondary lead frame structure includes the lead 108. In another example, the conductive structures 104, 106 and 108 our individual structures placed on a carrier, such as an adhesive tape, followed by die attach processing and other manufacturing stops in creating the packaged electronic device 100.

The packaged electronic device 100 includes a multi-layer substrate 110 with an isolator layer 112, such as a ceramic layer, that extends between and separates lower and upper metal layers. The isolator layer 112 is an electrical insulator. The isolator layer 112 includes an upper first side 113. The lower metal layer includes an electrically conductive first portion 114 connected to a lower second side 115 of the isolator layer 112, as well as an electrically conductive second portion 116 connected to the second side 115. In the example of FIGS. 1-3, the first portion 114 is electrically isolated from the second portion 116.

The example substrate 110 also includes an upper metal layer 118 (sometimes referred to herein as a first metal layer) that extends along a portion of the upper first side 113 of the isolator layer 112. The isolator layer 112 includes no conductive vias, and electrically isolates the first and second metal layers from one another such that the upper first metal layer 118 is electrically isolated from the lower metal layer 114, 116 (sometimes referred to herein as a second metal layer). In one example, the first and second metal layers include copper. In other implementations, different conductive metals can be used, such as aluminum, or combinations of conductive metal materials can be used.

In one example, the first metal layer 118 and the patterned second metal layer 114, 116 are formed on a starting isolator layer substrate 112 (e.g., ceramic material) using one or more suitable metallization materials and processes, such as direct bonded copper (DBC), active metal bonding (AMB), insulated metal substrate (IMS) processing, direct bonded aluminum (DBA), etc. The metal substrate features of the lower metal layers 114 and 116 can be patterned by etching, plating, or printing techniques according to the die layout. The conductive metal layers 114, 116 and 118 can be or include any suitable electrically conductive material, such as Cu, Ni, Pd, Ag, Au. In one example, the isolator layer 112 has a thickness (e.g., along the Z direction in FIG. 1) of 100 µm or more and about 300 µm or less, the first metal layer 118 has a thickness of 50 µm or more and 100 µm or less, and the second metal layer 114, 116 has a thickness of 50 µm or more and 100 µm or less.

The packaged electronic device 100 also includes a package structure 120 that encloses the sides of the first semiconductor die 101 and the second semiconductor die 102. In addition, the package structure 120 encloses portions of the die attach pad 104, portions of the leads 106 and 108, and portions of the substrate 110. In one example, the package structure 120 is a molded material, such as plastic. In another example, a ceramic packaging material can be used. The package structure 120 exposes bottom portions of the leads 106 and 108, as well as a bottom portion of the die attach pad 104, for example, to allow these features to be soldered to a host printed circuit board (PCB, not shown). In addition, side portions of the leads 106, 108 are exposed in the illustrated example, although not a strict requirement of all possible implementations. As further shown in FIGS. 2 and 3, the example packaged electronic device 100 is a QFN style package with device leads on four sides.

Referring again to FIG. 1, the first semiconductor die 101 includes a first contact 121 and a second contact 122 on or along an upper side 124 of the first semiconductor die 101. The contacts 121 and 122 are conductive features, such as copper or aluminum die pads exposed along an outer surface of the side 124 of the semiconductor die 101. In one example, the contacts 121 and 122 are or include solder 125, such as a solder bump to facilitate soldering operations during fabrication. The second contact 122 of the first semiconductor die 101 is soldered to the first portion 114 of the second metal layer along a lower side 126 of the substrate 110. In the cross-section shown in FIG. 1, the first contact 121 is soldered to the first lead 106 by a bond wire 127. In one example, other leads (not shown) of the packaged electronic device 100 are soldered to contacts of the respective first and/or second semiconductor dies 101, 102. The first semiconductor die 101 in this example includes a conductive contact 128 on a lower side 129 of the first semiconductor die 101. The lower side 129 of the first semiconductor die 101 is sometimes referred to herein as a first side, and the upper side 124 of the first semiconductor die 101 is sometimes referred to herein as a second side of the first semiconductor die 101. The first side 129 is connected to an upper first side 130 of the die attach pad 104, for example, by soldering the conductive contact 128 to the first side 130 of the die attach pad 104.

The second semiconductor die 102 includes a first contact 131 and a second contact 132 that extends on or along an upper side 134. The second semiconductor die 102 also includes a contact 138 connected (e.g., by soldering) to the first side 130 of the die attach pad 104. The contact 138 extends on or along a lower side 139 of the second semiconductor die 102. The lower side 139 of the second semiconductor die 102 is sometimes referred to herein as a first side, and the upper side 134 of the second semiconductor die 102 is sometimes referred to herein as a second side of the second semiconductor die 102. In the example of FIGS. 1-3, the first portion 114 of the second metal layer is soldered to the contact 122 of the first semiconductor die 101, and the first portion 114 is also soldered to the contact 131 of the second semiconductor die 102. In addition, the second portion 116 of the second metal layer is soldered to the contact 132 of the second semiconductor die 102.

The multi-layer substrate 110 has an upper first side 140 formed by an exposed portion of the first metal layer 118. The completed packaged electronic device 100 has an upper first side 141 and a lower second side 142. As shown in FIGS. 1 and 2, the exposed portion of the first side 140 of the substrate 110 provides an upper heat removal path for heat generated in or by one or both semiconductor dies 101 and/or 102. As shown in FIGS. 1 and 3, a lower second side 144 of the die attach pad 104 is exposed along the second side 142 of the packaged electronic device 100 to provide a second (lower) heat removal path for heat generated in or by one or both semiconductor dies 101 and/or 102. The lower side 126 of the substrate 110 is sometimes referred to herein as a second side of the substrate 110. The first side 130 of the die attach pad 104 is soldered to the contact 128 of the first semiconductor die 101 and to the contact 138 of the second semiconductor die 102 in the example of FIGS. 1-3.

As shown in FIG. 1, the first metal layer 118 is formed on the first side 113 of the example isolator layer 112, and the second metal layer 114, 116 is formed on the second side 115 of the isolator layer 112. In one example, the second metal layer 114, 116 is a patterned metal layer, such as copper, with features of the first and second portions 114 and 116 designed to interconnect specific contacts of the first and second semiconductor dies 101, 102. In the illustrated example, the second portion 116 is also connected (e.g., soldered) to the conductive post 109 to electrically connect the contact 132 of the second semiconductor die 102 to the lead 108.

The dies 101 and 102 and the substrate 110 can be separately manufactured and introduced with a leadframe into a packaging process as described further below in connection with FIGS. 4-15 to produce the packaged electronic device 100 with topside interconnection and a topside exposed pad formed by the first metal layer 118. The substrate 110 provides a good thermal path from the upper second sides 124 and 134 of the respective first and second semiconductor dies 101 and 102 for a topside cooling path. In addition, the exposed first metal layer 118 is electrically isolated from the second metal layer 114, 116. This electrical isolation provides an isolated thermal pad that facilitates connection (e.g., gluing) of an external heat sink (not shown) to the first side 140 of the first metal layer 118 without electrically isolating thermal interface material (TIM) between the heat sink and the first metal layer 118. The substrate 110 in one example is soldered or otherwise attached on the respective second sides 124, 134 of the first and second semiconductor dies 101 and 102 to make both electrical and thermal contacts. The lower first sides 29 and 139 of the respective first and second semiconductor dies 101, 102 are connected (e.g., soldered) to make both electrical and thermal contacts to the underlying conductive die attach pad 104.

As discussed further below, one or more contacts (e.g., contact 121) are wire bonded for remaining I/O pins or other desired electrical connections to a host PCB and/or between dies. The example device 100 includes externally accessible leads on four sides, although not a strict requirement of all possible implementations. In one example, the packaged electronic device 100 is molded with a QFN package shape as shown in FIGS. 1-3. Other finished package shapes can be provided in other examples, with bottom and topside thermal paths to facilitate heat removal to an underlying host PCB and to the topside ambient or an attached heat sink. In one implementation, the second semiconductor die 102 of the packaged electronic device 100 includes a high voltage transistor (e.g., a gallium nitride (GaN) FET) with a drain terminal connected to the contact 132 (e.g., labeled "D" in FIG. 1) and a source terminal connected to the contact 131 (e.g., labeled "S" in FIG. 1).

The first portion 114 of the second metal layer electrically connects the transistor source terminal to the contact 122 of the first semiconductor die 101. In this example, the first semiconductor die 101 includes gate driver circuitry to control operation of the transistor of the second semiconductor die 102. The first semiconductor die 101 provides an electrical connection between the contact 122 on the second side 124 to the contact 128 on the lower first side 129. In addition, the second semiconductor die 102 provides an electrical connection between the contact 131 on the upper second side 134 to the contact 138 on the lower first side 139. In this example, the die attach pad 104 is electrically connected to the transistor source terminal, and the lower second side 144 of the die attach pad 104 can be soldered to a ground or other reference voltage connection of a host PCB (not shown). In addition to the electrical source connection, the die attach pad 104 operates as a thermally conductive thermal pad to draw heat away from the respective lower first sides 129 and 139 of the semiconductor dies 101 and 102 and into the underlying host PCB structure. In this example, moreover, the second portion 116 of the second metal layer of the substrate 110 provides electrical connection from the transistor drain terminal (e.g., contact 132 of the second semiconductor die 102) to the lead 108 through the conductive post 109. This electrical connection allows connection of the transistor drain terminal to a host PCB by soldering the lead 108 to a corresponding PCB pad (not shown).

In one application, the transistor drain terminal may be connected to high-voltage signals relative to the ground or other reference voltage of the source terminal. The first metal layer 118 is exposed along the first side 141 of the package structure 120. The isolator layer 112 extends between and separates the first metal layer 118 from the second metal layer 114, 116 to provide electrical isolation. The electrical isolation of the first and second metal layers of the substrate 110 advantageously prevents application of a high voltage to the first metal layer 118, and a conductive heat sink structure can be soldered or otherwise attached to the upper first side 140 of the substrate 110 without requiring electrically isolating thermal interface material. In this example, the second metal layer 114, 116 is soldered to the contact 122 of the first semiconductor die 101 and to the contacts 131 and 132 of the second semiconductor die 102. In this manner, the example substrate 110 facilitates thermal transfer to remove heat from the upper second sides 124 and 134 of the respective first and second semiconductor dies 101 and 102, through the substrate 110, and upward in FIG. 1 to an ambient of the packaged electronic device 100 or to any attached heat sink (not shown). The package structure 120 in the example of FIGS. 1-3 encloses the first semiconductor die 101 and the second semiconductor die 102, as well as portions of the die attach pad 104, the substrate 110 and portions of the device leads 106, 108.

Figure 4:
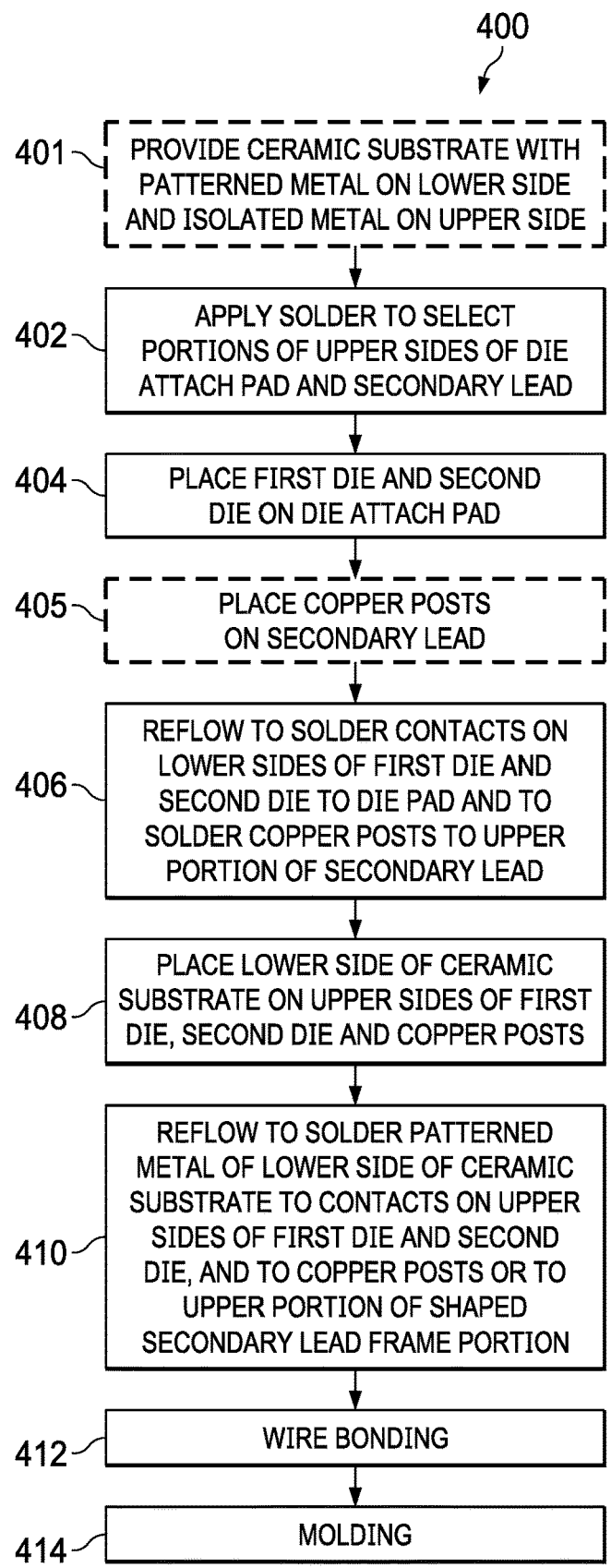
FIG. 4 is a flow diagram of a method for making a packaged electronic device.
Figure 5:
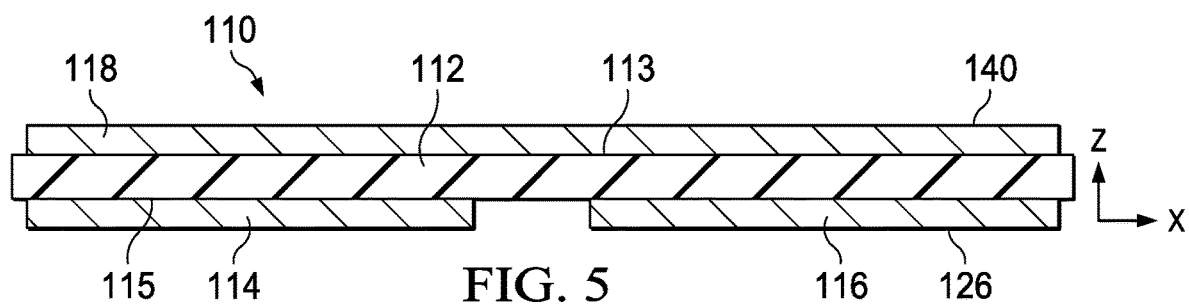
FIG. 5 is a sectional side elevation view of a substrate of the packaged electronic device of FIGS. 1-3 taken along lines 5-5 in FIGS. 6 and 7.
Figure 6:
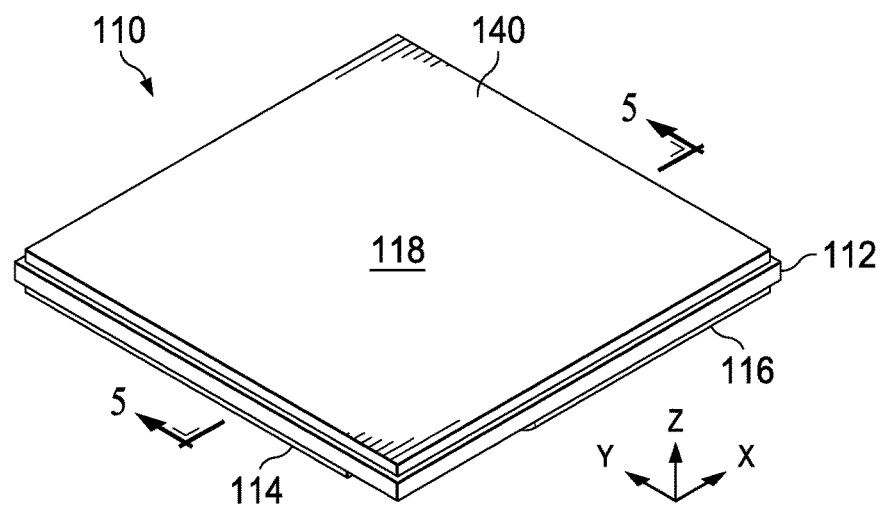
FIG. 6 is a top perspective view of the substrate of FIGS. 5 and 7.
Figure 7:
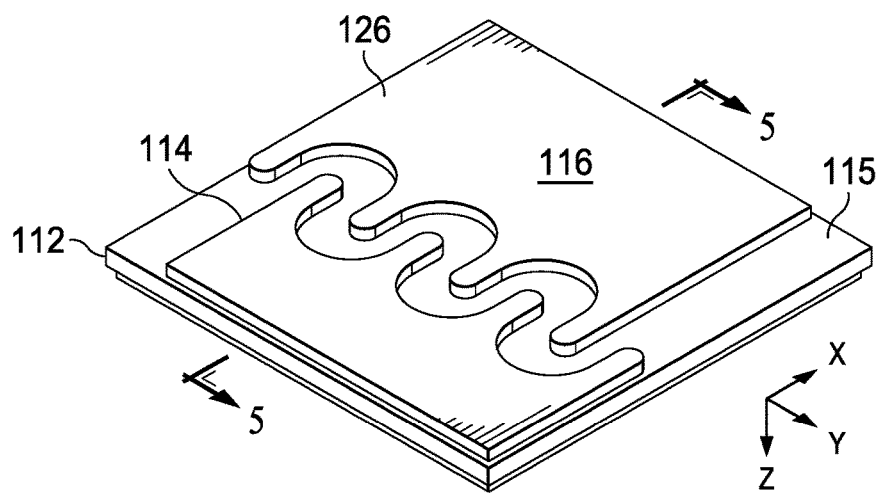
FIG. 7 is a bottom perspective view of the substrate of FIGS. 5 and 6.

Referring now to FIGS. 4-17, FIG. 4 shows a method 400 for making a packaged electronic device, and FIGS. 5-15 shows the example packaged electronic device 100 undergoing fabrication processing according to the method 400. In the example of FIG. 4, a ceramic substrate with patterned metal on the lower side and an isolated metal on an upper side is provided at 401. FIGS. 5-7 show an example of the substrate 110 as illustrated and described above in connection with FIG. 1, which is provided at 401 in FIG. 4. In one example, the substrate 110 is separately manufactured, for example, beginning with a ceramic or other isolator substrate 112. In one implementation, the first metal layer 118 and the patterned second metal layer 114, 116 are formed on the isolator layer 112 using one or more of DBC, AMB, IMS and DBA processing at 401. In one example, the substrate 110 is provided as an input component to the process 400 as shown in FIG. 4. In another possible implementation, the fabrication of the substrate 110 is included within the method 400. FIG. 6 shows an example top perspective view of the substrate 110, with a generally uniform first metal layer 118 formed on the upper first side 113 of the isolator layer 112 along the upper side 140 of the substrate 110. FIG. 5 shows a sectional side elevation view of the substrate 110 taken along lines 5-5 of FIGS. 6 and 7. FIG. 7 in this example shows an example patterned copper configuration of the first portion 114 and the second portion 116 of the second metal layer formed on the lower second side 115 of the isolator layer 112 along the lower second side 126 of the substrate 110.

Figure 8:
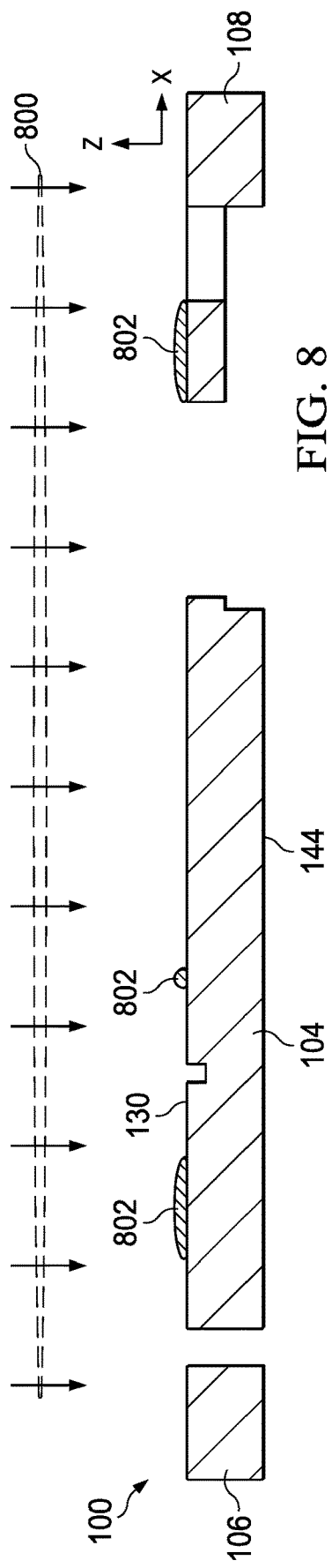
FIG. 8 is a sectional side elevation view of a lead frame with a die attach pad and leads.

The method 400 continues at 402 in FIG. 4 with applying solder to select portions of the upper sides of the die attach pad and any included secondary lead. FIG. 8 shows one example, in which a solder deposition process 800 is performed that applies solder 802 to specific portions of the upper first side 130 of the die attach pad 104 and the top side of the secondary lead 108. In one example, a silk-screening process 800 applies the solder at 402 using with a solder mask (not shown). In another example, a printing process 800 applies the solder at 402.

Figure 9:
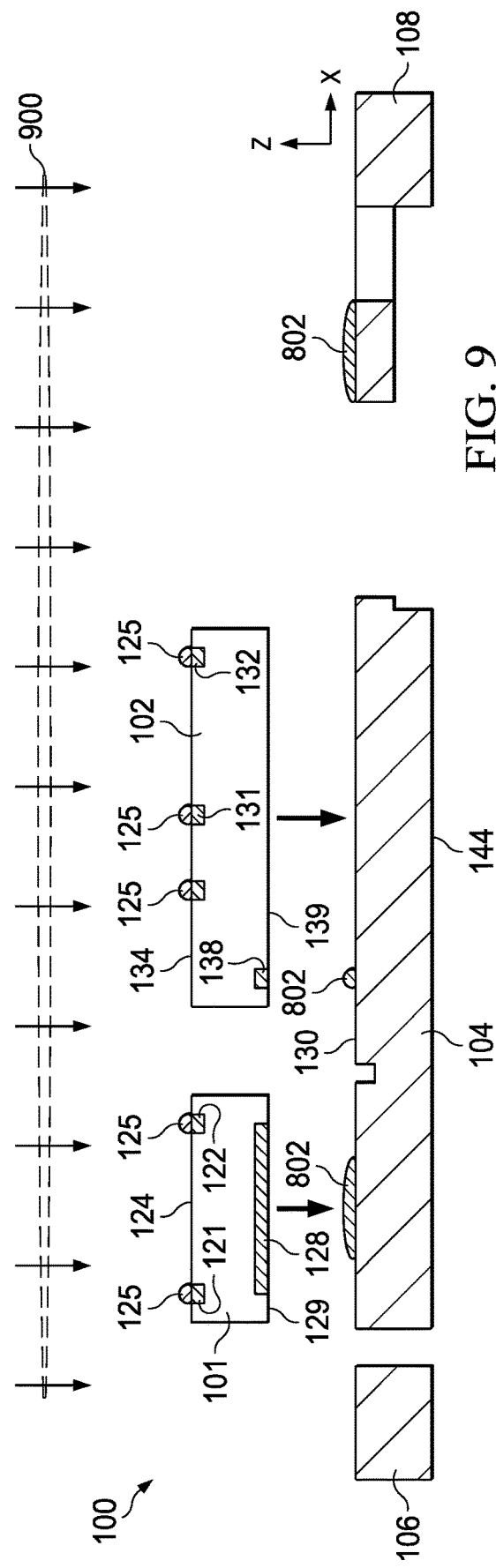
FIG. 9 is a sectional side elevation view of first and second semiconductor dies being placed on the first side of the die attach pad.
Figure 10:
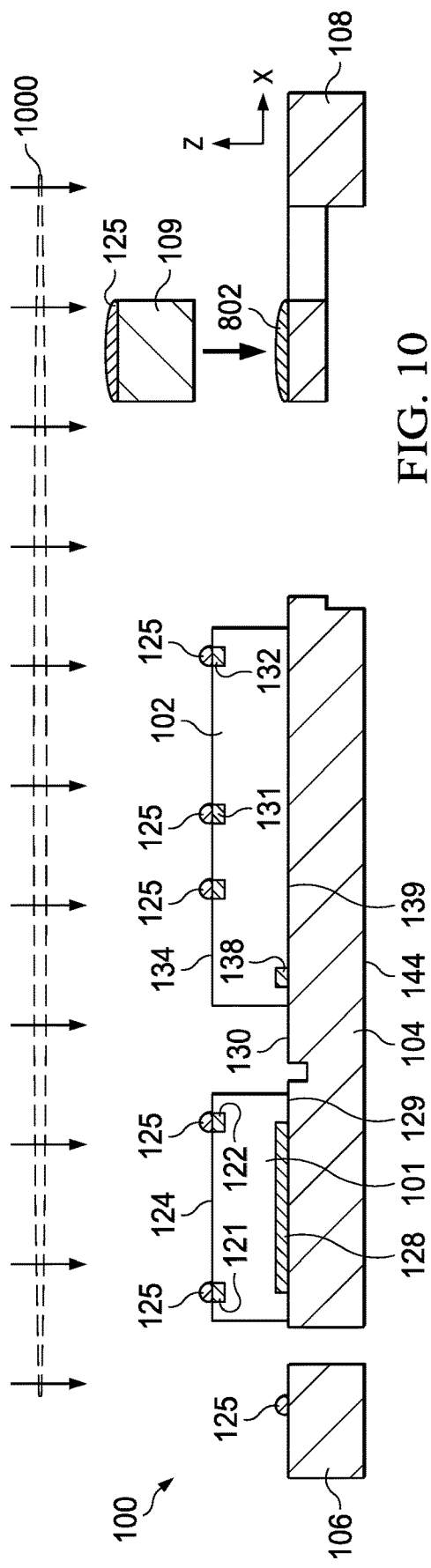
FIG. 10 is a sectional side elevation view of a conductive post being placed on a side of a secondary lead of the lead frame.

And 404, the method 400 continues with placing the first and second semiconductor dies on the die attach pad. FIG. 9 shows one example, in which a die attach process 900 is performed that attaches the lower first sides 129 and 139 of the respective first and second semiconductor dies 101 and 102 to the upper first side 130 of the die attach pad 104. In one example, the die attach process 900 includes operating automatic pick and place machinery (not shown) to position the semiconductor dies 101 and 102 at predesignated locations on the first side 130 of the die attach pad as further shown in FIG. 10. At 405 in FIG. 4, the method 400 further includes placing one or more conductive posts (e.g., copper) on a secondary lead. FIG. 10 illustrates one example, in which a conductive post placement process 1000 is performed that places the conductive post 109 on a predesignated location of the upper side of the secondary lead 108. Any suitable placement process 1000 can be used, such as an automated pick and place process using suitable machinery (not shown). As discussed further below in connection with FIG. 16, in another implementation, the copper post placement at 405 can be omitted from the method 400.

Figure 11:
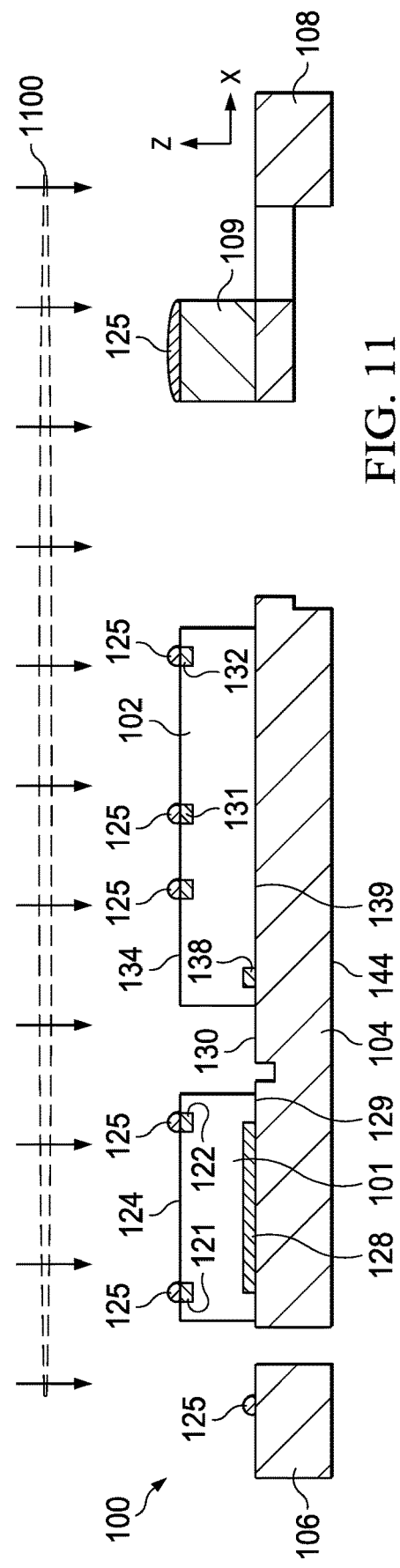
FIG. 11 is a sectional side elevation view of the semiconductor dies and lead frame taken along line 11-11 of FIG. 12, showing a reflow process that solders the semiconductor dies to the die attach pad and solders the conductive post to the secondary lead.
Figure 12:
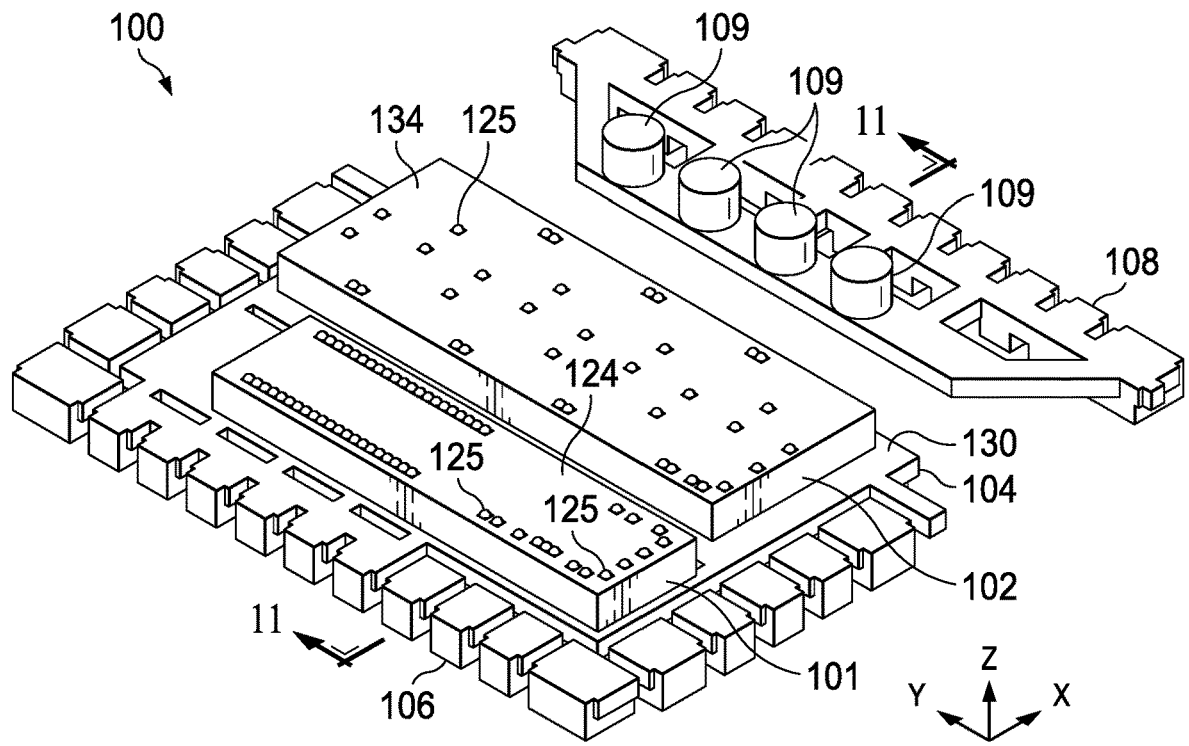
FIG. 12 is a top perspective view of the semiconductor dies and lead frame undergoing the reflow process of FIG. 11.

The method 400 continues at 406 in FIG. 4 with reflowing the solder in order to solder the semiconductor die contacts to the die attach pad and to solder any included conductive posts to the upper portion of the secondary lead. FIGS. 11 and 12 show one example, in which a thermal reflow process 1100 is performed in FIG. 11 that reflows the pre-placed solder in order to solder contacts on the lower sides 129 and 139 of the respective first and second dies 101 and 102 to the first side 130 of the die attach pad 104, and to solder one or more copper posts 109 to the upper portion of the secondary lead 108 as shown in FIG. 12. In one example, multiple copper posts 109 are soldered to a secondary lead frame portion having multiple associated secondary leads 108 as shown in FIG. 8.

Figure 13:
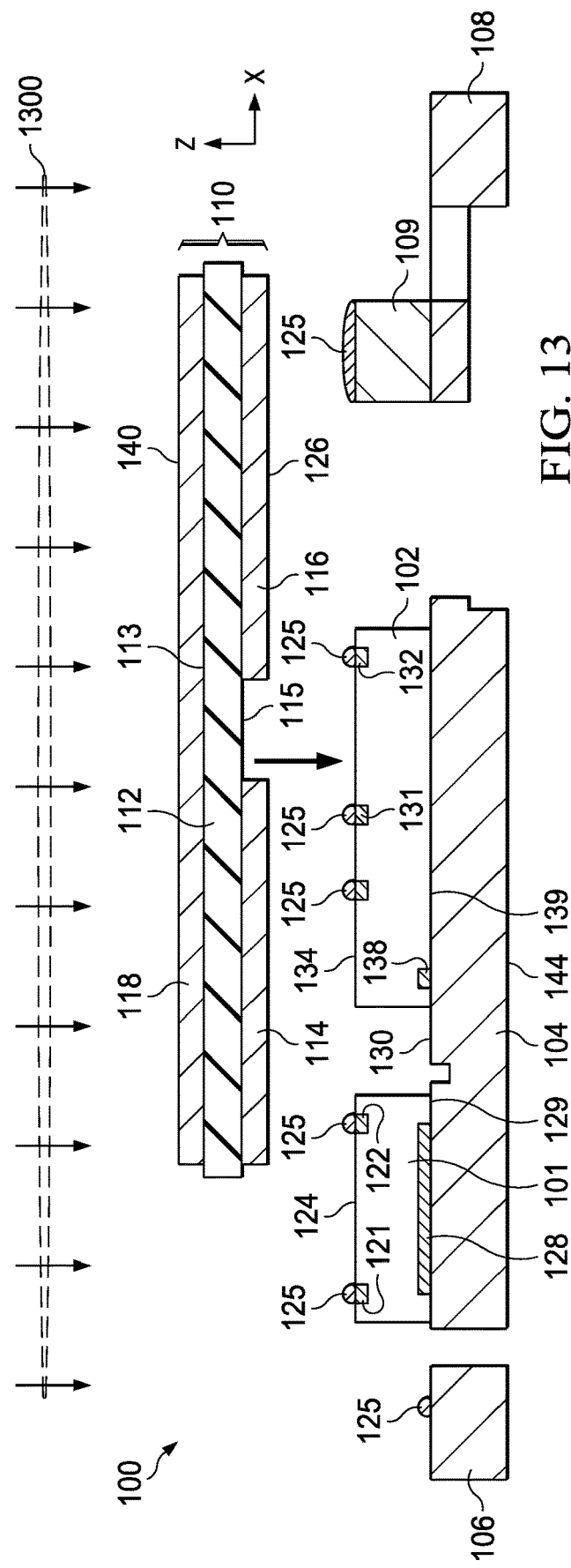
FIG. 13 is a sectional side elevation view showing the substrate of FIGS. 5-7 being placed on the semiconductor dies and conductive posts of FIGS. 11 and 12.

The method 400 continues at 408 and 410 in FIG. 4 with attaching the substrate 110 to the semiconductor dies and any included conductive post. At 408, the method 400 includes placing the lower side of the ceramic substrate on the upper sides of the first and second semiconductor dies and any included conductive posts. FIG. 13 shows one example, in which a placement process 1300 is performed that places the second metal layer 114, 116 of the second side 126 of the substrate 110 onto the second side 124 of the first semiconductor die 101 and onto the second side 134 of the second semiconductor die 102. In one example, the top side of the conductive post 109 is provided with solder 125, and the first and second semiconductor dies 101 and 102 include solder bumps 125 formed on the corresponding contacts 121, 122, 131 and 132 of the respective upper second sides 124 and 134 as shown in FIG. 13. In another example, silk-screening, printing or other solder application processing is performed prior to substrate placement in order to apply the solder 125 as shown in FIG. 13. In this example, the placement process 1300 also places part of the lower side 126 of the second portion 116 onto the top surface of the conductive post 109 as shown in FIG. 14.

Figure 15:
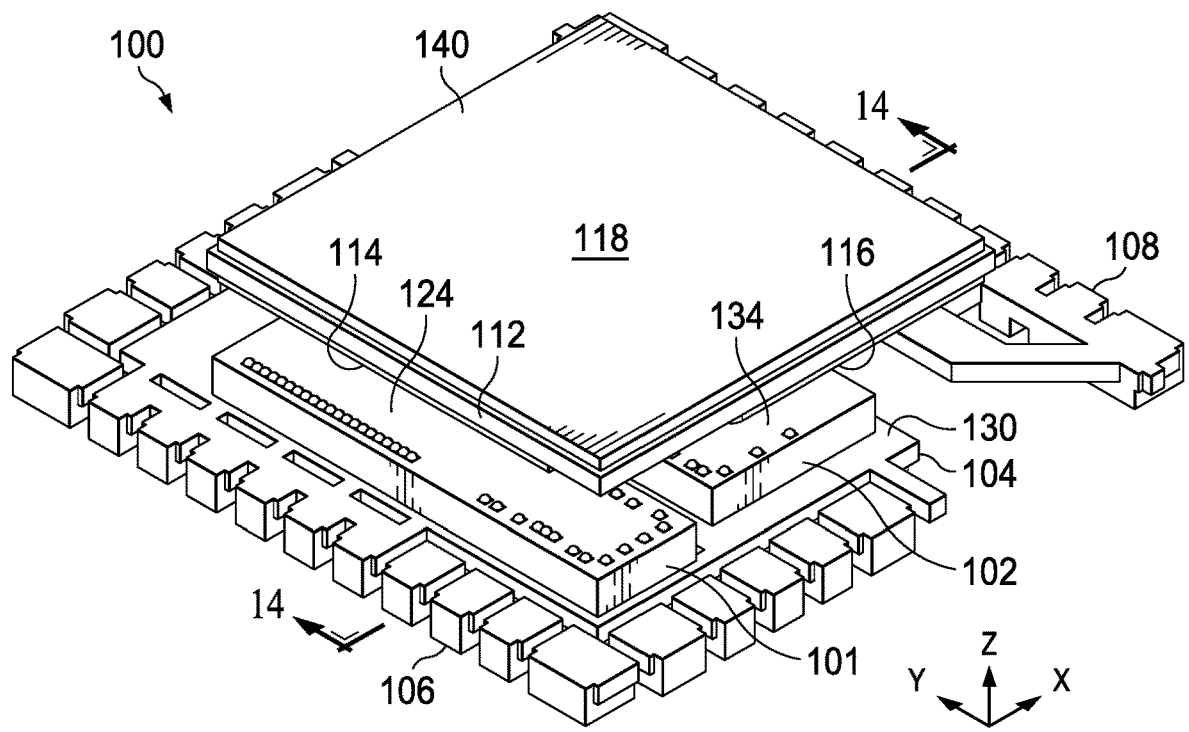
FIG. 15 is a top perspective view of the semiconductor dies and the substrate undergoing the reflow process of FIG. 14.

Referring also to FIGS. 14 and 15, the method 400 continues at 410 in FIG. 4 with reflowing the solder to join the second metal layer of the substrate with the semiconductor dies and the conductive post. FIG. 14 illustrates one example, in which a thermal reflow process 1400 is performed that reflows the solder 125 to join the lower second side 126 of the second metal layer to the contacts 122, 131 and 132 of the respective semiconductor dies 101 and 102. The process 1400 also solders the second portion 116 of the second metal layer to the top side of the conductive post 109, leaving the partially completed device 100 as shown in FIG. 5.

The method 400 continues at 412 in FIG. 4 with wire bonding. FIG. 16 shows one example, in which a wire bonding process 1600 is performed that attaches one or more bond wires 127 between predesignated contacts and/or leads. The example cross-sectional view of FIG. 16 shows one example bond wire 127 with a first end soldered to the contact 121 of the first semiconductor die 101 and a second end soldered to the lead 106. The wire bonding process 1600 in one example creates multiple bond wire connections between contacts of the dies 101 and 102, between one of the dies and a lead, or combinations thereof. In one example discussed above, the first semiconductor die 101 includes driver circuitry, with various contacts soldered to corresponding leads of the packaged electronic device 100 to interface the driver circuitry with an external host circuit (not shown), and certain implementations may include more than two semiconductor dies, with corresponding bond wire connections (not shown) to or between associated contacts of any included additional semiconductor dies.

Figure 17:
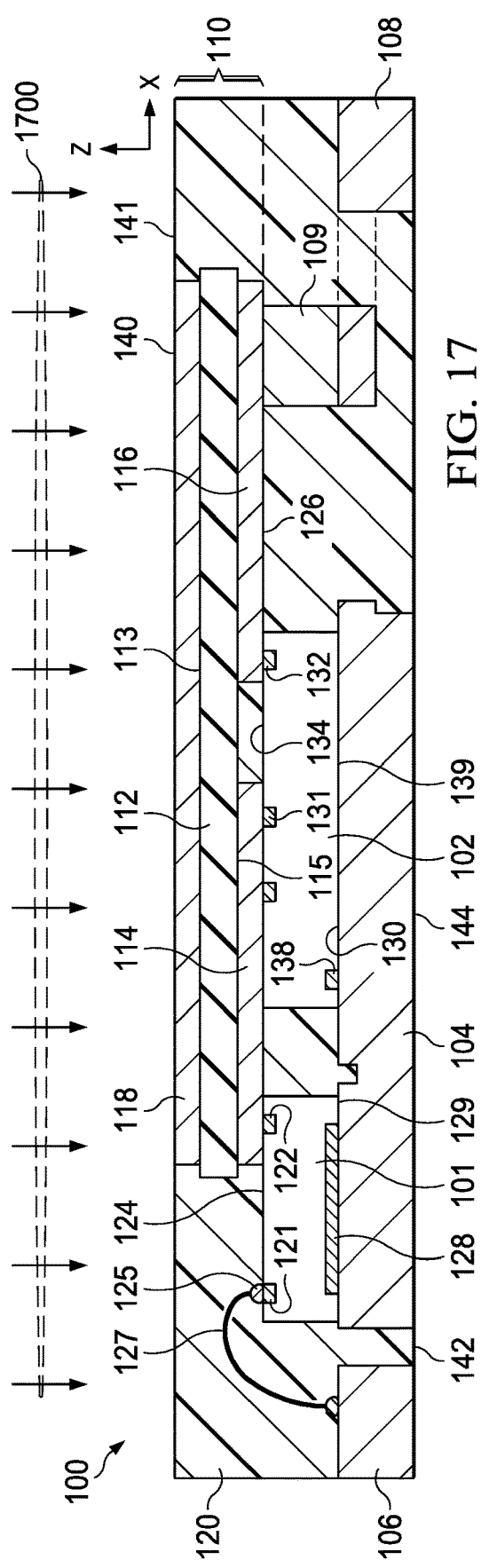
FIG. 17 is a sectional side elevation view of the substrate soldered to the top sides of the semiconductor dies and the conductive posts undergoing a molding process to form a package structure.

The method 400 continues at 414 in FIG. 4 is molding to form a package structure. FIG. 17 shows one example, in which a molding process 1700 is performed that forms the example molded package structure 120 that encloses the first semiconductor die 101 and the second semiconductor die 102. The package structure 120 in one example includes the first side 141 that exposes the first metal layer 118 of the first side 140 of the substrate 110, and the lower second side 142 that exposes the second side 144 of the die attach pad 104. As discussed above, the resulting packaged electronic device 100 of FIGS. 1 and 17 provides a current top and bottom side cooling paths to facilitate improved power density and energy efficiency for a variety of different semiconductor circuit types, including switching power supplies and associated power transistors in one or both semiconductor dies 101 and 102.

Figure 18:
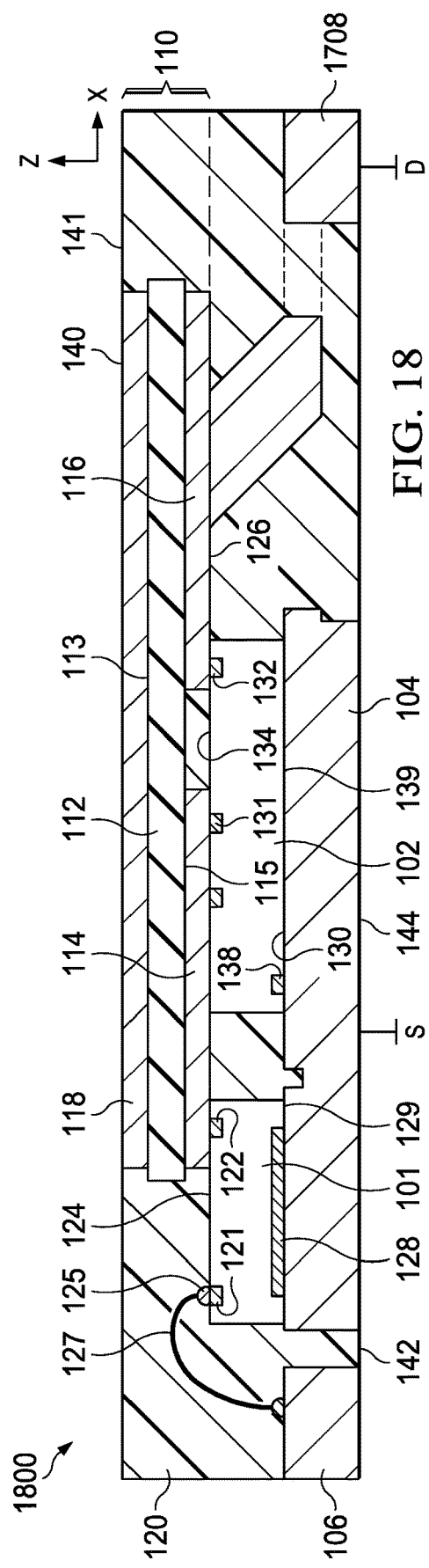
FIG. 18 is a sectional side elevation view of another example packaged electronic device.

FIG. 18 shows a sectional side elevation view of another example packaged electronic device 1800, including the features as described above in connection with the device 100 of FIG. 1. Unlike the packaged electronic device 100, the packaged electronic device 1800 of FIG. 18 does not include the lead 108 or the conductive post 109 described above. Instead, the drain connection in the device 1800 is formed by a shaped clip lead 1708 that extends to the bottom side 142 of the packaged electronic device 1800, and includes an angled portion soldered directly to the second portion 116 of the second metal layer of the substrate 110. The example packaged electronic device 1800 can be fabricated using the example method 400 of FIG. 4 above, with the placement of the copper posts at 405 being omitted.

The example packaged electronic devices 100 and 1800, and the example method 400 provide solutions to facilitate unidirectional package cooling (e.g., top side and bottom side cooling) in packaged devices that include lateral FETs or other semiconductor dies having contact or pad layouts with multiple nodes on the die topside. The described concepts employ an isolated substrate structure 110 that facilitates compact dual-side cooling, and the illustrated techniques can be used in combination with standard lead frames for die attach and an insulated substrate for topside interconnection. The illustrated example shows implementations to provide a packaged electronic device 100, 1800 with a final standard QFN package form. Improved thermal management through double sided cooling helps to lower the transistor junction temperature and can improve device reliability and help increase power density. The dual side cooling technique divides the thermal resistance network of the transistor to two in parallel paths, and the reduced junction to ambient thermal resistance (e.g., $R_{theta,j-a}$) facilitates higher power capacity of the package and/or lower junction temperature.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A packaged electronic device, comprising:
a package structure that encloses a first semiconductor die and a second semiconductor die, the package structure including a first side and an opposite second side;
a die attach pad, including a first side connected to a contact of one of the first semiconductor die and the second semiconductor die, and an opposite second side exposed along the second side of the package structure; and
a substrate, including:
a first metal layer exposed along the first side of the package structure,
a second metal layer connected to a contact of the first semiconductor die and to a contact of the second semiconductor die, and
an isolator layer that extends between and separates the first and second metal layers.

2. The packaged electronic device of claim 1, wherein the second metal layer is electrically isolated from the first metal layer.

3. The packaged electronic device of claim 2, wherein the isolator layer includes a ceramic material.

4. The packaged electronic device of claim 2, wherein the second side of the die attach pad is soldered to a contact of the first semiconductor die and to a contact of the second semiconductor die.

5. The packaged electronic device of claim 2, wherein the second metal layer includes a first portion, and a second portion, and wherein the first portion is electrically isolated from the second portion.

6. The packaged electronic device of claim 1, wherein the second metal layer includes a first portion, and a second portion, and wherein the first portion is electrically isolated from the second portion.

7. The packaged electronic device of claim 6,
wherein the first portion of the second metal layer is soldered to a contact of the first semiconductor die;
wherein the first portion of the second metal layer is soldered to a contact of the second semiconductor die; and
wherein the second portion of the second metal layer is soldered to a contact of the second semiconductor die.

8. The packaged electronic device of claim 7, further comprising a lead connected to the second portion of the second metal layer, wherein lead is exposed along the second side of the package structure.

9. The packaged electronic device of claim 1, further comprising a lead connected to the second portion of the second metal layer, wherein lead is exposed along the second side of the package structure.

10. The packaged electronic device of claim 1, wherein the package structure includes plastic or ceramic material.

11. The packaged electronic device of claim 1, wherein the first metal layer and the second metal layer include copper, nickel, palladium, silver or gold.

12. The packaged electronic device of claim 1, wherein the first side of the die attach pad is solder connected to the contact of one of the first semiconductor die.

13. The packaged electronic device of claim 1, wherein the second metal layer is solder connected to a contact of the first semiconductor die and to a contact of the second semiconductor die.

14. The package electronic device of claim 1, wherein the isolator layer 112 has a thickness of 100 μm or more and about 300 μm or less.

15. The package electronic device of claim 14, wherein the first metal layer has a thickness of 50 μm or more and 100 μm or less, and the second metal layer has a thickness of 50 μm or more and 100 μm or less.

16. A packaged electronic device, comprising:
a die attach pad, including a first side, and an opposite second side;
a first semiconductor die, including a first side connected to the first side of the die attach pad, and an opposite second side, the second side of the first semiconductor die including a first contact and a second contact;
a second semiconductor die, including a first side connected to the first side of the die attach pad, and an opposite second side, the second side of the second semiconductor die including a first contact and a second contact;
a substrate, including:
an isolatorg layer, including a first side and an opposite second side, a first metal layer formed on the first side of the isolatorg layer, and a second metal layer formed on the second side of the isolatorg layer, the second metal layer connected to the second side of the first semiconductor die, the second metal layer connected to the second side of the second semiconductor die, and the second metal layer electrically isolated from the first metal layer; and a package structure that encloses the first semiconductor die, the second semiconductor die, a portion of the die attach pad, and a portion of the substrate, the package structure including:

a first side that exposes a portion of the first metal layer of the substrate, and a second side that exposes a portion of the second side of the die attach pad.

17. The packaged electronic device of claim 16, wherein the second metal layer includes a first portion and a second portion, and wherein the first portion is electrically isolated from the second portion.

18. The packaged electronic device of claim 17,
wherein the first portion of the second metal layer electrically connects a contact of the second side of the first semiconductor die to a first contact of the second side of the second semiconductor die; and
wherein the second portion of the second metal layer is connected to a second contact of the second semiconductor die.

19. The packaged electronic device of claim 18, further comprising a lead connected to the second portion of the second metal layer; wherein the second side of the package structure exposes a portion of the lead.

20. The packaged electronic device of claim 17, further comprising a lead connected to the second portion of the second metal layer; wherein the second side of the package structure exposes a portion of the lead.

21. The packaged electronic device of claim 17, wherein the first metal layer and the second metal layer include copper, nickel, palladium, silver or gold.

22. The packaged electronic device of claim 16, wherein the first metal layer and the second metal layer include copper, nickel, palladium, silver or gold.

23. The packaged electronic device of claim 16, wherein the isolator layer is an electrical insulator.

24. The packaged electronic device of claim 16, wherein the isolator layer includes ceramic material.

25. The packaged electronic device of claim 16, wherein the package structure includes plastic or ceramic material.

26. The package electronic device of claim 16, wherein the isolator layer 112 has a thickness of 100 µm or more and about 300 µm or less.

27. The package electronic device of claim 16, wherein the first metal layer has a thickness of 50 µm or more and 100 µm or less, and the second metal layer has a thickness of 50 µm or more and 100 µm or less.

28. A method, comprising:
attaching a first side of a first semiconductor die to a first side of a die attach pad;
attaching a first side of a second semiconductor die to the first side of the die attach pad;
attaching a second metal layer of a second side of a substrate to a second side of the first semiconductor die and to a second side of the second semiconductor die; and forming a package structure that encloses the first semiconductor die and a second semiconductor die, the package structure including a first side that exposes a first metal layer of a first side of the substrate, and a second side that exposes a second side of the die attach pad.

29. The method of claim 28, further comprising:
attaching the second metal layer of the second side of the substrate to a lead.

30. The method of claim 29,
wherein attaching the second metal layer of the second side of the substrate to the lead includes:
attaching a conductive post to the lead; and
attaching the second metal layer of the second side of the substrate to the conductive post; and
wherein the second side of the package structure exposes a portion of the lead.

31. The method of claim 28, wherein attaching the second metal layer of the second side of the substrate to the second side of the first semiconductor die and to the second side of the second semiconductor die includes:
soldering the second metal layer of the second side of the substrate to a contact of the second side of the first semiconductor die,
soldering the second metal layer of the second side of the substrate to a contact of the second side of the second semiconductor die.

32. An apparatus, comprising:
a first side of a first semiconductor die connected to a first side of a die attach pad;
a first side of a second semiconductor die connected to the first side of the die attach pad;
a second metal layer of a second side of a substrate connected to a second side of the first semiconductor die and to a second side of the second semiconductor die; and
a package structure covering the first semiconductor die and a second semiconductor die, the package structure including a first side that exposes a first metal layer of a first side of the substrate, and a second side that exposes a second side of the die attach pad.

33. The apparatus of claim 32, further comprising:
the second metal layer of the second side of the substrate connected to a lead.

34. The apparatus of claim 33,
wherein the connection of the second metal layer of the second side of the substrate to the lead includes:
a conductive post connected to the lead; and
the second metal layer of the second side of the substrate connected to the conductive post; and
wherein the second side of the package structure exposes a portion of the lead.

35. The apparatus of claim 32, wherein the connection of the second metal layer of the second side of the substrate to the second side of the first semiconductor die and to the second side of the second semiconductor die includes:
the second metal layer of the second side of the substrate soldered to a contact of the second side of the first semiconductor die,
the second metal layer of the second side of the substrate soldered to a contact of the second side of the second semiconductor die.

* * * * *